(12) United States Patent
Tanaka et al.

(10) Patent No.: US 6,302,995 B1
(45) Date of Patent: Oct. 16, 2001

(54) LOCAL ETCHING APPARATUS

(75) Inventors: Chikai Tanaka, Kanagawa-Ken; Michihiko Yanagisawa, Ayase, both of (JP)

(73) Assignee: SpeedFam-IPEC Co., Ltd., Ayase (JP)

( * ) Notice: Subject to any disclaimer, the term of this patent is extended or adjusted under 35 U.S.C. 154(b) by 0 days.

(21) Appl. No.: 09/392,113

(22) Filed: Sep. 8, 1999

(30) Foreign Application Priority Data

Jan. 11, 1999 (JP) ................................................. 11-004562

(51) Int. Cl.[7] ....................................................... C23F 1/02
(52) U.S. Cl. ................................................................ 156/345
(58) Field of Search ................................................ 156/345

(56) References Cited

U.S. PATENT DOCUMENTS

| 4,668,337 | * | 5/1987 | Sekine et al. | 156/643 |
| 4,876,983 | * | 10/1989 | Fukuda et al. | 118/722 |
| 6,053,984 | * | 4/2000 | Petvai et al. | 134/3 |

* cited by examiner

Primary Examiner—Robert Kunemund
Assistant Examiner—Charlotte A. Brown
(74) Attorney, Agent, or Firm—Burr & Brown (57) ABSTRACT

A local etching apparatus and local etching method improving the throughput of the local etching apparatus by preheating a discharge tube before ignition of the plasma discharge. The local etching apparatus is provided with a plasma generator 1, an alumina discharge tube 2, and a heater 6. The heater 6 is constituted by a heating wire 60, a power source 61 for supplying voltage to the heating wire 60, and a voltage regulator 62 for controlling the voltage supplied from the power source 61 to the heating wire 60. Due to this, it is possible to heat the alumina discharge tube 2 to the desired temperature by the heater 6 immediately before the plasma discharge by the plasma generator 1. As a result, there is no need to wait with the local etching work until the alumina discharge tube 2 rises in temperature to the desired temperature due to the heat by the plasma discharge, that is, it is possible to perform the local etching work immediately after the plasma discharge.

10 Claims, 6 Drawing Sheets

LOCAL ETCHING APPARATUS

BACKGROUND OF THE INVENTION

1. Field of the Invention

The present invention relates to a local etching apparatus and a local etching method for locally etching a protrusion on a surface of a wafer by radicals or locally etching a relatively thick portion of a wafer so as to make the distribution of thickness of the wafer uniform.

2. Description of the Related Art

Figure 10:
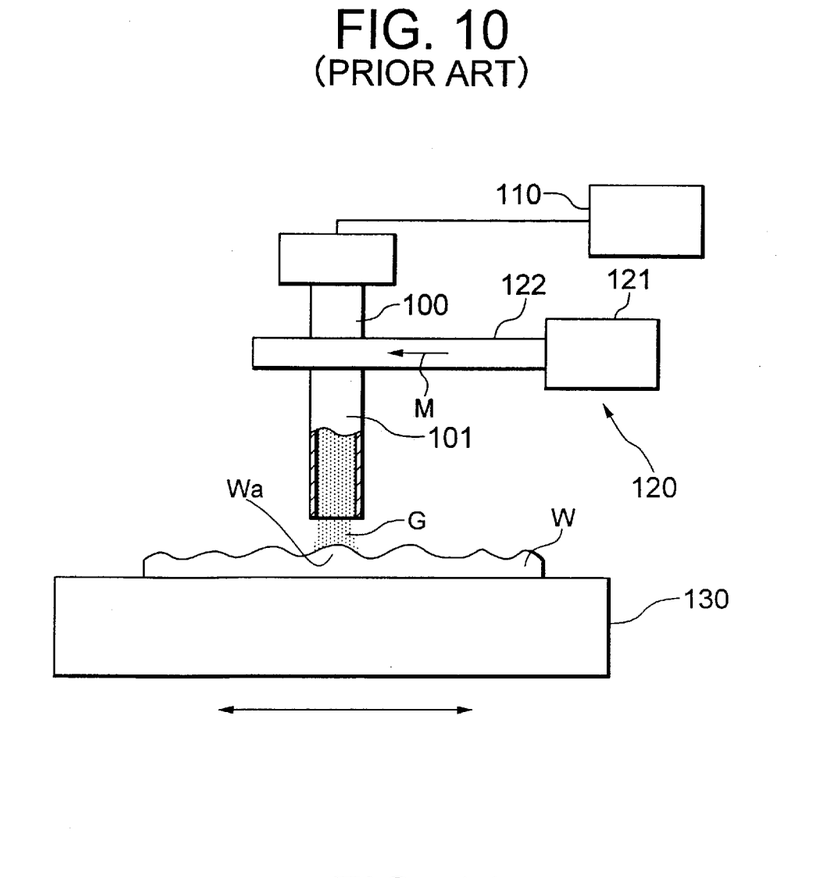
FIG. 10 is a schematic sectional view of an example of a local etching apparatus of the related art.

FIG. 10 is a schematic sectional view of an example of a local etching apparatus of the related art.

This local etching apparatus is provided with a discharge tube 100, a gas feed device 110, a plasma generator 120, and a stage 130.

Due to this configuration, it is possible to feed gas from the gas feed device 110 to the discharge tube 100, generate microwaves M from a microwave generator 121 of the plasma generator 120 to the inside of a waveguide 122 to cause plasma discharge of the gas in the discharge tube 100, and spray the radicals G produced by the plasma discharge from a nozzle portion 101 of the discharge tube 100 on to a wafer W on the stage 130.

By making the stage 130 move in the horizontal direction, a portion Wa relatively thicker than a defined thickness on the surface of the wafer W (hereinafter referred to as a "relatively thick portion") is guided directly under the nozzle 101 where the radicals G are sprayed from the nozzle 101 to the relatively thick portion Wa to locally etch the relatively thick portion Wa. By locally etching the entire surface of the wafer W in this way, it is possible to make the distribution of the surface thickness of the wafer W uniform and flatten the surface of the wafer W as a whole.

The above local etching apparatus of the related art, however, had the following problems.

The depth of local etching of the wafer W by the radicals G depends on the temperature of the discharge tube 100.

Figure 11:
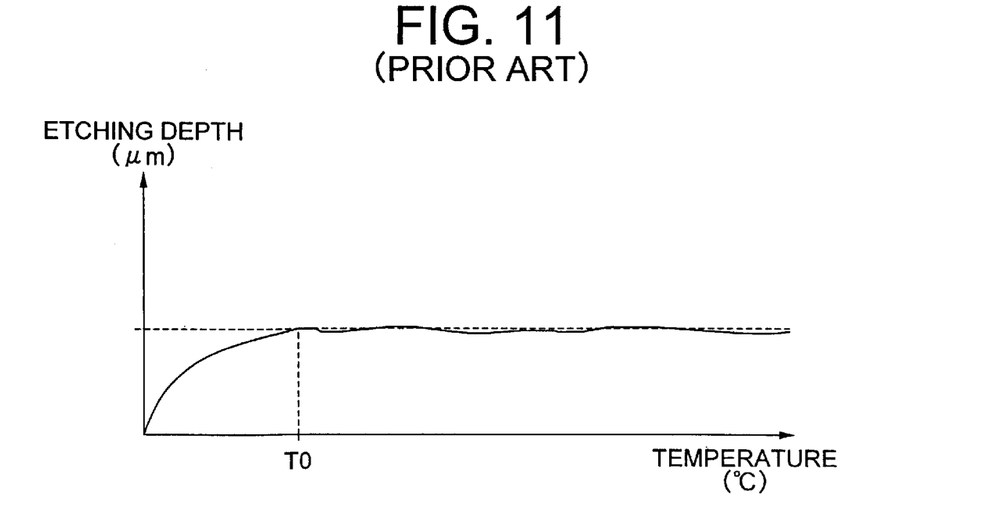
FIG. 11 is a view of the correspondence between a surface temperature of a discharge tube and an etching rate.

FIG. 11 is a graph depicting the correlation between the surface temperature of the discharge tube 100 and the etching depth.

As shown in FIG. 11, the etching depth by the radicals G increases with the rise of the surface temperature of the discharge tube 100. When the surface temperature of the discharge tube 100 reaches a certain value $T_0$, the etching depth at temperatures above the temperature $T_0$ becomes substantially constant.

At the time of ignition of the plasma discharge in the discharge tube 100, the discharge tube 100 is cold. The temperature of the discharge tube 100 rises in time due to the heat of the plasma. Therefore, the etching depth of the wafer W by the radicals G will not stabilize until the surface temperature of the discharge tube 100 reaches temperature $T_0$. Accordingly, if the etching work is commenced before the surface temperature of the discharge tube 100 reaches $T_0$, the etching rate of the wafer W becomes unstable and it is not possible to flatten the wafer W to a high precision. In view of this, in the local etching apparatuses of the related art, it was necessary to allow for a long standby time for the surface temperature of the discharge tube 100 to reach $T_0$. It was not possible to start the etching work during the standby period. As a result, the throughput of the flattening of the wafer W was low and the mass producibility was poor.

SUMMARY OF THE INVENTION

The present invention was made to solve the above problem and has as its object the provision of a local etching apparatus and local etching method improving the throughput of the local etching apparatus by preheating the discharge tube before ignition of the plasma discharge.

To achieve the above object, according to a first aspect of the present invention, there is provided a local etching apparatus comprising: a discharge tube with a spray port of a nozzle portion facing an object to be etched in a chamber; a plasma generator for causing plasma discharge of a predetermined gas in the discharge tube so as to produce radicals for locally etching a relatively thick portion present on a surface of the object to be etched; and a heater for heating the discharge tube to a predetermined temperature.

Due to this configuration, it is possible to use the heater to heat the discharge tube to a predetermined temperature, specifically to at least a temperature at which the etching depth of the object to be etched becomes substantially constant. Suitably thereafter, the plasma generator is used to cause plasma discharge of a predetermined gas in the discharge tube to produce radicals for locally etching a relatively thick portion present on the surface of the object to be etched. Further, by making the nozzle portion of the discharge tube move along the surface of the object to be etched, it is possible to locally etch a relatively thick portion present on the surface of the object to be etched by the radicals sprayed from the nozzle portion. In this way, since it is possible to preheat the discharge tube to at least a temperature at which the etching depth of the object to be etched becomes substantially constant, there is no need to wait to perform the local etching work until the discharge tube rises to a predetermined temperature by the heat due to the plasma discharge, such as with the local etching apparatus of the related art, and it is possible to immediately perform local etching at a stable etching depth by performing the local etching work.

Various heaters may be considered for heating the discharge tube, but giving a preferable example of a heater, according to an embodiment of the invention, the heater is provided with: a heating member surrounding the discharge tube and capable of raising the temperature in accordance with voltage applied thereto; and a voltage controller for controlling the voltage applied to the heating member. In particular, according to an embodiment of the invention, the heating member of the heater is a heating wire wound around the discharge tube. Further, as another preferable example of the heater, according to an embodiment of the invention, the heater is an optical heater which emits infrared rays or a laser beam to the discharge tube to heat the discharge tube. Further, as another example, according to an embodiment of the invention, the heater is provided with: a heating block arranged to surround the discharge tube in a state contacting the outer side of the discharge tube and has a fluid feed port and fluid exhaust port communicating with a fluid storage portion at the inside; and a fluid feeder for heating the fluid to a predetermined temperature and feeding it to the fluid storage portion of the heating block. In particular, according to an embodiment of the invention, the heating block of the heater is comprised of a thin tube wound around the discharge tube.

Note that it is possible to use various types of discharge tubes as the discharge tube for the local etching apparatus. Therefore, according to an embodiment of the invention, the discharge tube used is any one of an alumina discharge tube, an aluminum nitride discharge tube, a sapphire discharge tube, and a quartz discharge tube.

Note that the steps executed by the local etching apparatuses in their operation also stand as method inventions.

Therefore, according to a second aspect of the present invention, there is provided a local etching method comprising: a plasma generating step for causing plasma discharge of a predetermined gas in a discharge tube so as to produce radicals and spraying the radicals from a nozzle portion of the discharge tube; a local etching step for locally etching a relatively thick portion present on the surface of the object to be etched by the radicals sprayed from the nozzle portion while making the nozzle portion of the discharge tube move relatively along the surface of the object to be etched; and a heating step for heating the discharge tube at least to a time of start of plasma discharge of the plasma generating step to at least a temperature at which the etching depth of the object to be etched at the local etching step becomes substantially constant.

In the heating step, the discharge tube may be heated at least until the time of the start of the plasma discharge of the plasma generating step and a heating time is arbitrary.

Therefore, according to an embodiment of the invention, the heating step is comprised of heating the discharge tube to the above temperature at all times. Further, according to an embodiment of the invention, the heating step is comprised of heating the discharge tube to the temperature until the start of plasma discharge of the plasma generating step.

The heated location of the discharge tube is arbitrary. As one example, according to an embodiment of the invention, the heating step is comprised of heating a location of the discharge tube between the plasma discharge location and the spray port of the discharge tube to the temperature.

Further, according to an embodiment of the invention, the heating step is comprised of raising the temperature of a heating member surrounding the discharge tube by application of voltage so as to heat the discharge tube to the temperature. Further, according to an embodiment of the invention, the heating step is comprised of emitting infrared rays or a laser beam to the discharge tube to heat the discharge tube to the temperature. Further, according to an embodiment of the invention, the heating step is comprised of feeding a heated fluid into a heating block arranged so as to surround the discharge tube in a state contacting the outer side of the discharge tube so as to heat the discharge tube to the temperature.

BRIEF DESCRIPTION OF THE DRAWINGS

The above and other objects, features, and advantages of the present invention will become more readily apparent from the following detailed description of a presently preferred embodiment of the invention taken in conjunction with the accompanying drawings, in which.

DESCRIPTION OF THE PREFERRED EMBODIMENTS

Preferred embodiments of the present invention will be explained next with reference to the drawings.
(First Embodiment)

Figure 1:
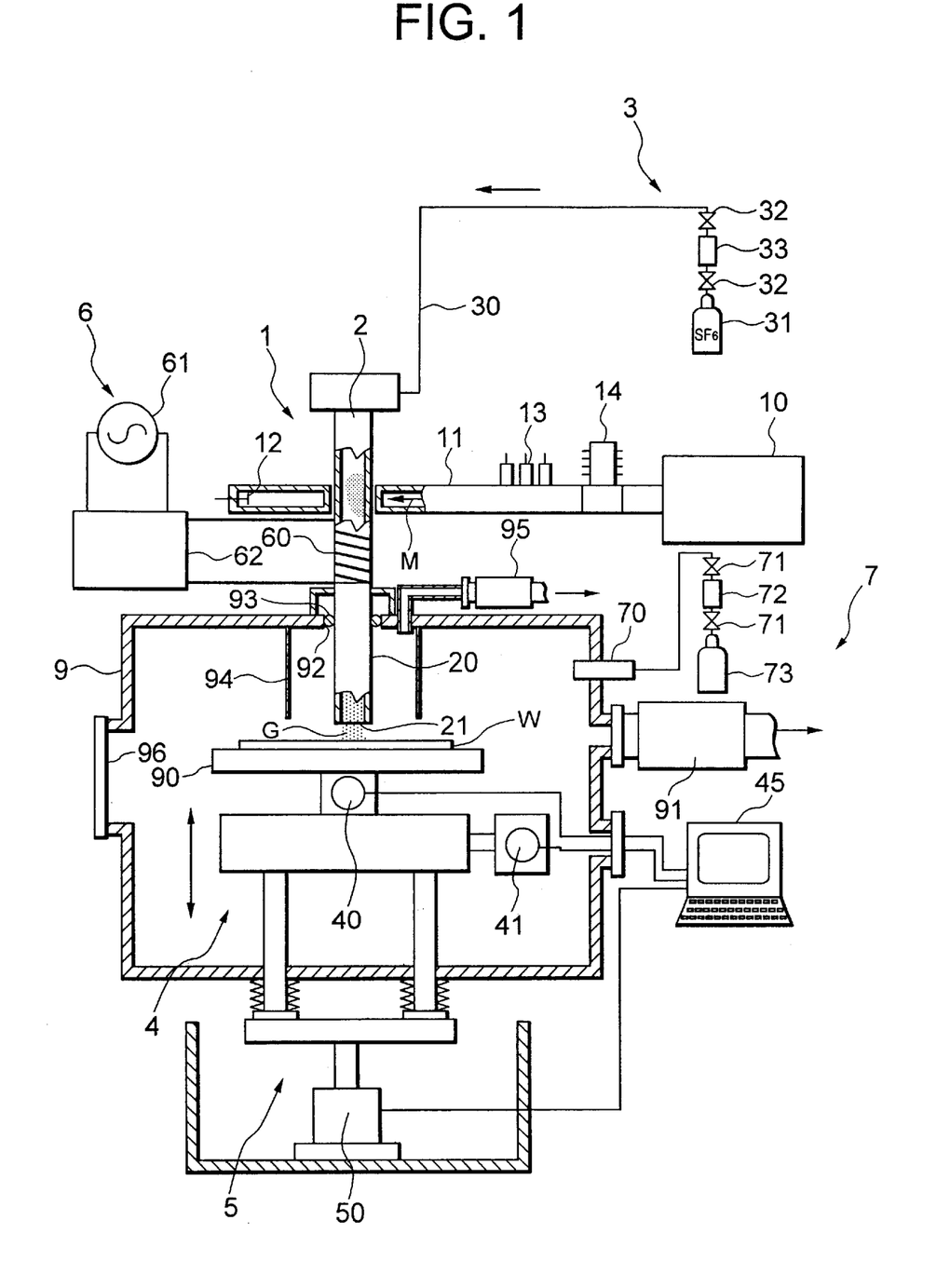
FIG. 1 is a partially cutaway schematic view of the configuration of a local etching apparatus according to a first embodiment of the present invention.

FIG. 1 is a partially cutaway schematic view of the configuration of a local etching apparatus according to a first embodiment of the present invention.

As shown in FIG. 1, the local etching apparatus is provided with a plasma generator 1, an alumina discharge tube 2, a gas feeder 3, an X-Y drive 4, a Z-drive 5, and a heater 6.

The plasma generator 1 is a device for plasma discharge of the gas inside the alumina discharge tube 2 to produce radicals G and is comprised of a microwave generator 10 and a waveguide 11.

The microwave generator 10 is a magnetron and can generate a microwave M of a predetermined frequency.

The waveguide 11 is for guiding the microwave M generated by the microwave generator 10 and fits over the alumina discharge tube 2.

At the inside of the left end of the waveguide 11 is attached a reflection plate 12 (short plunger) for reflecting the microwave M to form a standing wave. Further, in the middle of the waveguide 11 is attached a 3-stub tuner 13 for phase alignment of the microwave M and an isolator 14 for bending the reflected microwave M heading toward the microwave generator 10 90° in direction (surface direction of FIG. 1) to prevent the reflected wave from returning to the generator.

The alumina discharge tube 2 is a cylinder having a nozzle portion 20 at its lower end and is connected at its upper end to a feed pipe 30 of the gas feeder 3.

The gas feeder 3 is a device for feeding gas into the alumina discharge tube 2 and has a $SF_6$ (sulfur hexafluoride) gas cylinder 31. The gas cylinder 31 is connected to the feed pipe 30 through a valve 32 and a flow control device 33.

By adopting this configuration for the plasma generator 1, when a gas is fed from the gas feeder 3 to the alumina discharge tube 2 and a microwave M is generated from the microwave generator 10, plasma discharge is caused in the alumina discharge tube 2 and the activated species gas G produced by the plasma discharge is sprayed from the spray port 21 of the nozzle portion 20.

An object to be etched, here a silicon wafer W, is designed to be held by the electrostatic force of the chuck 90 in a chamber 9 when placed on the chuck 90. The chamber 9 is provided with a vacuum pump 91. The vacuum pump 91 may be used to make the inside of the chamber 9 a vacuum. Further, a hole 92 is formed in the center of the top surface of the chamber 9. The nozzle portion 20 of the alumina discharge tube 2 is inserted through this hole 92 into the chamber 9. An O-ring 93 is attached between the hole 92 and the alumina discharge tube 2 to make the space between the hole 92 and the alumina discharge tube 2 air-tight.

A duct 94 is provided around the nozzle portion 20 inserted into the hole 92. By driving the vacuum pump 95, the reaction product gas at the time of etching is exhausted to the outside of the chamber 9.

The X-Y drive 4 is arranged inside the chamber 9 and supports the chuck 90 from below.

The X-Y drive 4 makes the chuck 90 move in a lateral direction in FIG. 1 by an X-drive motor 40 and makes the chuck 90 and the X-drive motor 40 move together in a direction perpendicular to the surface of the paper on which FIG. 1 is drawn by a Y-drive motor 41. Thus, it is possible to make the nozzle portion 20 move in the X-Y direction relative to the silicon wafer W by the X-Y drive 4.

A Z-drive 5 supports the X-Y drive 4 in the chamber 9 from below. The Z-drive 5 makes the X-Y drive 4 move in the vertical direction by a Z-drive motor 50 and enables the distance between the spray port 21 of the nozzle portion 20 facing the silicon wafer W side and the surface of the silicon wafer W to be adjusted.

The drive operations of the X-drive motor 40 and Y-drive motor 41 of the X-Y drive 4 and the Z-drive motor 50 of the Z-drive 5 are controlled by a control computer 45 based on a predetermined program.

The heater 6 is a heating device for heating the alumina discharge tube 2 to a desired temperature and is provided with a heating wire 60 as a heating member, a power source 61 for supplying voltage to the heating wire 60, and a voltage regulator 62 for controlling the voltage supplied from the power source 61 to the heating wire 60 and constituting a voltage controller together with the power source 61.

Figure 2:
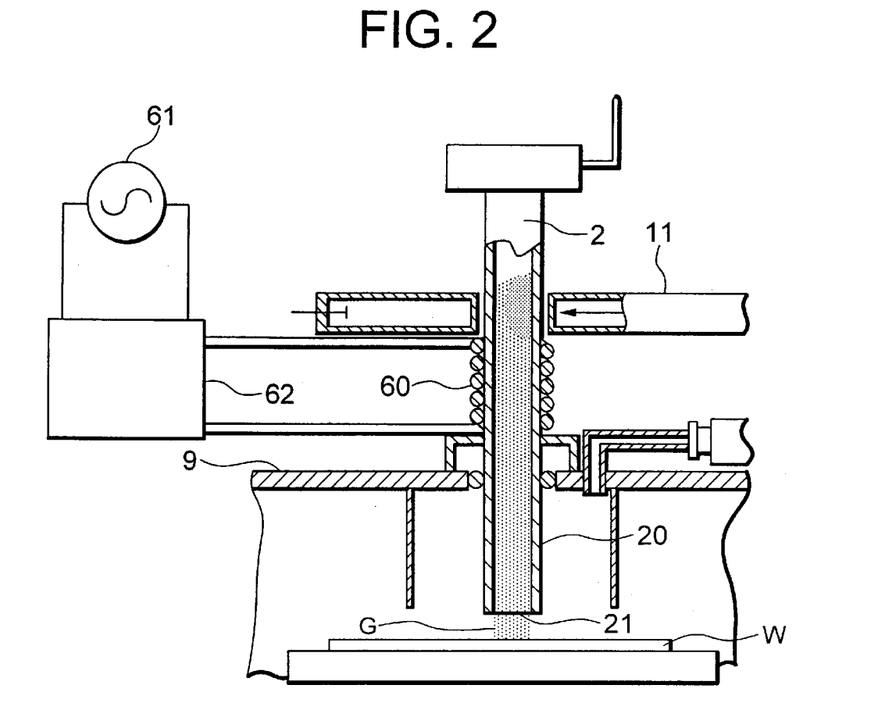
FIG. 2 is a partial enlarged sectional view for showing the heater.

The heating wire 60 is a nichrome wire and, as shown in FIG. 2, is wound around the outer circumference of the alumina discharge tube 2 so as to surround a predetermined location of the alumina discharge tube 2. Specifically, the heating wire 60 is wound around a location below a discharge location where the waveguide 11 and the alumina discharge tube 2 intersect. Further, the two ends of the heating wire 60 are electrically connected to the voltage regulator 62 outside the chamber 9. The voltage regulator 62 is electrically connected to the power source 61.

Due to this, by turning the power source 61 on and adjusting the voltage regulator 62 so as to control the voltage supplied to the heating wire 60, the heating wire 60 will rise to a temperature corresponding to the supplied voltage and the alumina discharge tube 2 will be heated to the desired temperature.

Note that in FIG. 1, reference numeral 7 is an etching region limiter which is provided with a nozzle 70 attached to the chamber 9 with its opening facing the inside of the chamber 9 and an $N_2$ (nitrogen) gas storage cylinder 73 connected to the nozzle 70 through a valve 71 and a flow rate controller 72.

Next, an explanation will be given of the operation of the local etching apparatus of this embodiment. Note that since it is possible to execute the local etching method according to the aspect of the present invention by operating the local etching apparatus, the explanation will be given along with the steps of that method.

First, the plasma generation step is executed.

That is, by turning the power source 61 of the heater 6 shown in FIG. 1 on and controlling the voltage supplied to the heater wire 60 by the voltage regulator 62, the heating wire 60 wound around the alumina discharge tube 2 is heated and the temperature of the alumina discharge tube 2 is increased to a predetermined temperature $T_0$ by that heat. The temperature $T_0$ is the temperature shown in FIG. 11. In an alumina discharge tube 2, it is for example 100° C. If the alumina discharge tube 2 is raised above this temperature $T_0$, the etching depth of the wafer W in the later explained local etching step becomes substantially constant.

When the surface temperature of the alumina discharge tube 2 reaches the above mentioned $T_0$° C. by the execution of this heating step, the power source 61 is turned off and the plasma generation step is executed.

That is, the vacuum pump 91 is driven to make the inside of the chamber 9 a predetermined low atmospheric pressure state and the Z-drive 5 is operated to raise the X-Y drive 4 as a whole and bring the silicon wafer W close to the opening 21 of the nozzle portion 20.

Further, the valve 32 of the gas feeder 3 is opened to feed the $SF_6$ gas in the gas cylinder 31 through the feed pipe 30 to the inside of the alumina discharge tube 2. At this time, the degree of opening of the valve 32 and the flow rate controller 33 are adjusted to adjust the flow rate of the $SF_6$ gas to, for example, 300 sccm.

Simultaneously with the above operation of feeding the $SF_6$ gas, the microwave generator 10 is driven. The microwave M causes plasma discharge of the $SF_6$ gas and production of radicals G including F (fluorine) radicals. Due to this, the radicals G are guided into the nozzle portion 20 of the alumina discharge tube 2 and sprayed from the spray port 21 of the nozzle portion 20 to the silicon wafer W side. Suitably thereafter, the degree of opening of the valve 71 of the etching region limiter 7 and the flow rate controller 72 are adjusted to adjust the flow rate of the $N_2$ gas from the nozzle portion 20 to, for example, 500 sccm, the pressure of the $SF_6$ gas inside the nozzle portion 20 is set to 1.5 Torr, and the diameter of the flow of the radicals G sprayed from the nozzle portion 20 is reduced to limit the etching region to the desired size.

The local etching step is executed in this state.

That is, the control computer 45 is used to drive the X-Y drive 4 and make the chuck 90 holding the silicon wafer W move zigzag in the X-Y direction.

Figure 3:
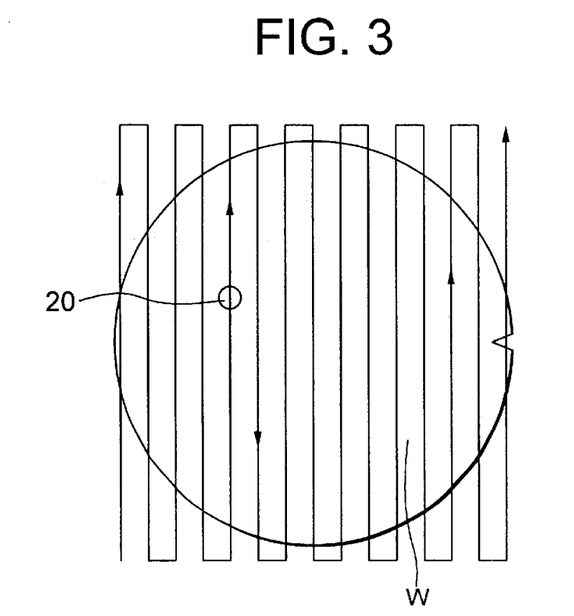
FIG. 3 is a schematic plan view of the state of the nozzle portion scanning a silicon wafer.
Figure 4:
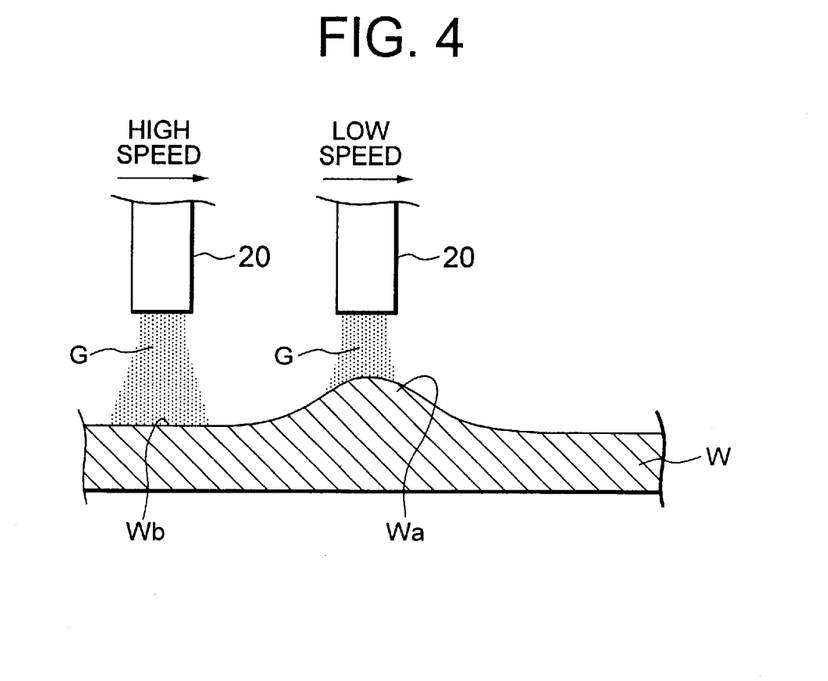
FIG. 4 is a partial enlarged sectional view of a silicon wafer for showing a local etching process.

Specifically, as shown in FIG. 3, the nozzle portion 20 is made to scan the silicon wafer W relatively in a zigzag pattern. At this time, the relative speed of the nozzle portion 20 with respect to the silicon wafer W is set so as to be substantially inversely proportional to the thickness of the relatively thick portion. Due to this, as shown in FIG. 4, the nozzle portion 20 moves directly over the non-relatively thick portion Wb at a high speed and decreases in speed in accordance with the thickness of the relatively thick portion Wa when above the relatively thick portion Wa. As a result, the etching time of the relatively thick portion Wa increases and the relatively thick portion Wa is shaved flat. The entire surface of the silicon wafer W is locally etched in this way.

At this time, due to the heat of the plasma discharge, the temperature of the alumina discharge tube 2 becomes higher than the above mentioned temperature $T_0$, so the etching depth with respect to the entire surface of the silicon wafer W becomes substantially constant. As a result, the surface of the silicon wafer W is flattened by a substantially uniform etching depth.

After the process for flattening one wafer W in this way is finished, the microwave generator 10 of the plasma generator 1 shown in FIG. 1 is turned off to stop the plasma discharge, and the power source 61 of the heater 6 is turned on to execute the heating step. Due to this, it is possible to maintain the lowest value of the falling temperature of the alumina discharge tube 2 after the plasma discharge is stopped at the above temperature $T_0$.

In this state, a robot, for example, is used and the gate valve 96 is opened to take out the silicon wafer W on the chuck 90, convey the processed silicon wafer W to a predetermined location, and set the second silicon wafer W on the chuck 90.

Suitably thereafter, when the plasma generation step is executed, the temperature of the alumina discharge tube 2 rises from a temperature of an initial value of the temperature $T_0$. Therefore, it is possible to perform the local etching step on the second silicon wafer W immediately without waiting for the temperature of the alumina discharge tube 2 to rise to the temperature $T_0$. Similarly, it is possible to perform the local etching step on a third and later silicon wafers W immediately.

In this way, according to the local etching apparatus of this embodiment, since it is possible to execute the local etching step immediately without waiting for the temperature of the alumina discharge tube 2 to rise to the temperature $T_0$ due to the preheating effect of the heater 6, it is possible to greatly increase the number of silicon wafers W processed per unit time, that is, the throughput.

The present inventors conducted the following experiments to provide evidence of this point.

Figure 5:
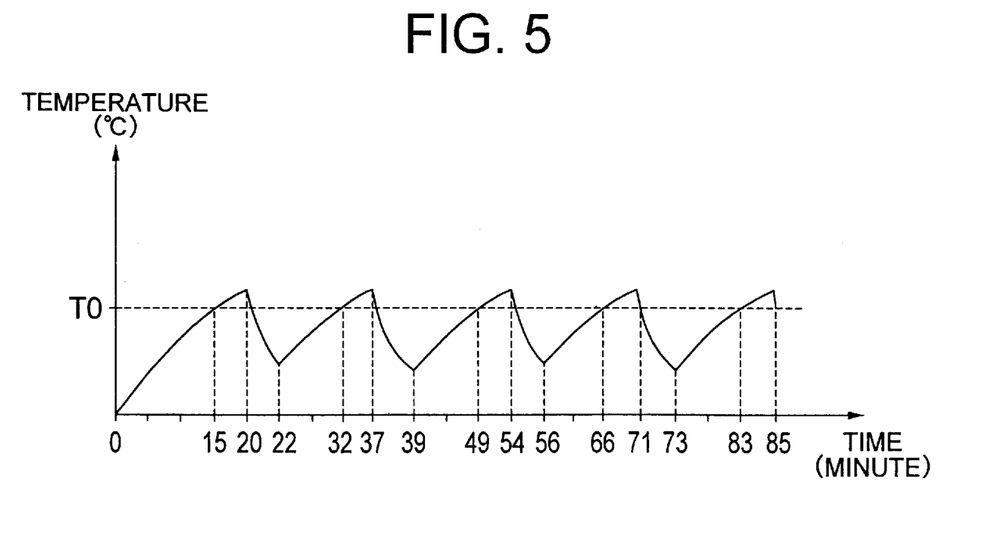
FIG. 5 is a graph of the correspondence between the time when performing flattening work without preheating an alumina discharge tube and the temperature of the alumina discharge tube.
Figure 6:
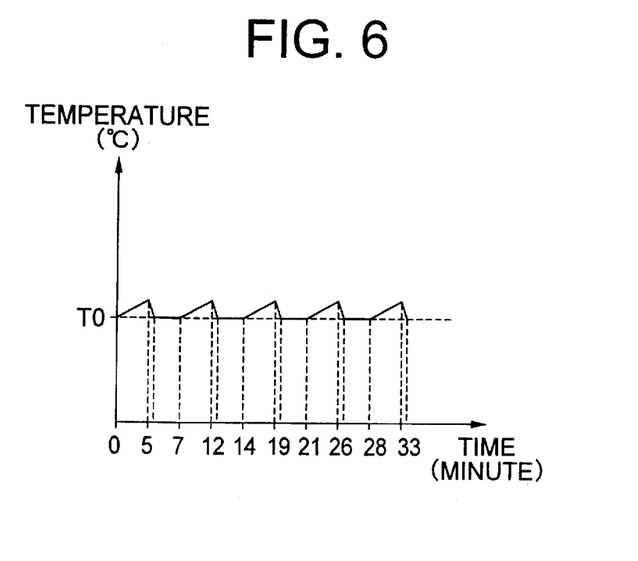
FIG. 6 is a graph of the correspondence between the time when performing flattening work with preheating of an alumina discharge tube and the temperature of the alumina discharge tube.

FIG. 5 is a graph of the correspondence between time for performing the flattening work without preheating the alumina discharge tube 2 and the temperature of the alumina discharge tube 2. FIG. 6 is a graph of the correspondence between time for performing the flattening work with preheating of the alumina discharge tube 2 and the temperature of the alumina discharge tube 2.

As shown in FIG. 5, during the work for flattening the first silicon wafer W, it takes 15 minutes for the temperature of the alumina discharge tube 2 to reach the temperature $T_0$ when executing the plasma generation step to cause plasma discharge at minute 0. Further, the 5-minute local etching step was performed by minute 20, then the plasma discharge was stopped and the transfer step executed. It took approximately 2 minutes for the transfer of the silicon wafer W.

Suitably thereafter, the work for flattening the second silicon wafer W was started at minute 22. At the time of this work, residual heat due to the plasma discharge at the work for flattening the first silicon wafer W remained. It therefore took 10 minutes for the temperature of the alumina discharge tube 2 to reach the temperature $T_0$. Further, the 5-minute local etching step was executed by minute 37, then the plasma discharge was stopped and the 2-minute transfer step was executed by minute 39.

Further, in the work for flattening the third and later silicon wafers W, the same time as the work for flattening the second silicon wafer W was required.

That is, as shown in FIG. 5, the flattening work for five silicon wafers W can be completed in 85 minutes.

As opposed to this, when preheating the alumina discharge tube 2 before the flattening work, as shown in FIG. 6, since the alumina discharge tube 2 was preheated, during the work for flattening the first silicon wafer W, the temperature of the alumina discharge tube 2 reached the temperature $T_0$ when executing the plasma generation step at minute 0. It was therefore possible to execute the 5-minute local etching step by minute 5. Further, when the plasma discharge was stopped and the heating step executed and the step for transferring the second silicon wafer W was performed in 2 minutes before minute 7, the temperature of the alumina discharge tube 2 was held at the temperature To by the effect of the heating step. The 5-minute local etching step for the second silicon wafer W could therefore be immediately performed by minute 12. Further, in the work for flattening the third and later silicon wafers W, the same time as the work for flattening the second silicon wafer W was required.

That is, according to the local etching apparatus of this embodiment, as shown in FIG. 6, the time by which it was possible to complete the flattening work for five silicon wafers W was just 33 minutes. The throughput was about 2.6 times as that in the case of no preheating.

(Second Embodiment)

Figure 7:
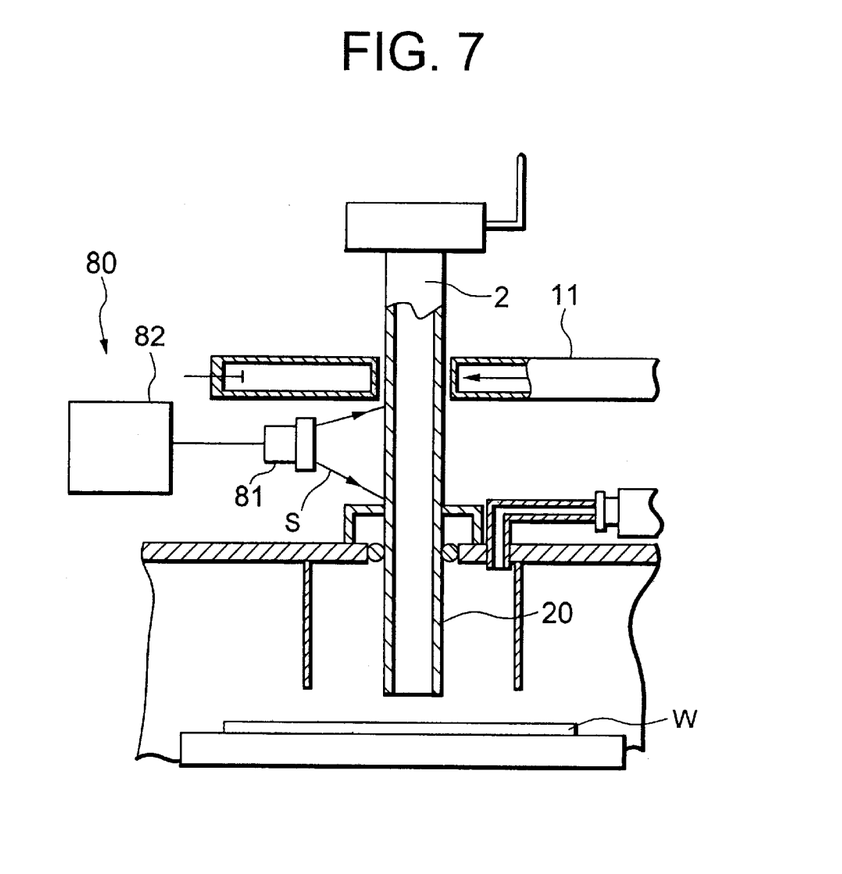
FIG. 7 is a sectional view of the essential portions of a local etching apparatus according to a second embodiment of the present invention.

FIG. 7 is a sectional view of the essential portions of a local etching apparatus according to a second embodiment of the present invention. Note that parts which are the same as those shown in FIG. 1 to FIG. 6 are given the same reference numerals.

This embodiment differs from the first embodiment in the point that use is made of an optical heater which heats the alumina discharge tube 2 by emitting infrared rays to the alumina discharge tube 2.

The optical heater 80, as shown in FIG. 7, is provided with a known halogen heater 81 and a power source 82. At the time of operation, it is possible to specifically work the local etching method according to the aspect of the invention.

Specifically, the halogen heater 81 is arranged in a state with its front facing a location lower than the discharge location where the waveguide 11 and alumina discharge tube 2 intersect. The infrared rays S from the not shown lamp of this halogen heater 81 are directed toward the above location of the alumina discharge tube 2 so as to heat the alumina discharge tube 2 to the above temperature $T_0$.

The rest of the configuration, mode of operation, and advantageous effects are similar to those of the above first embodiment, so descriptions thereof will be omitted.

(Third Embodiment)

Figure 8:
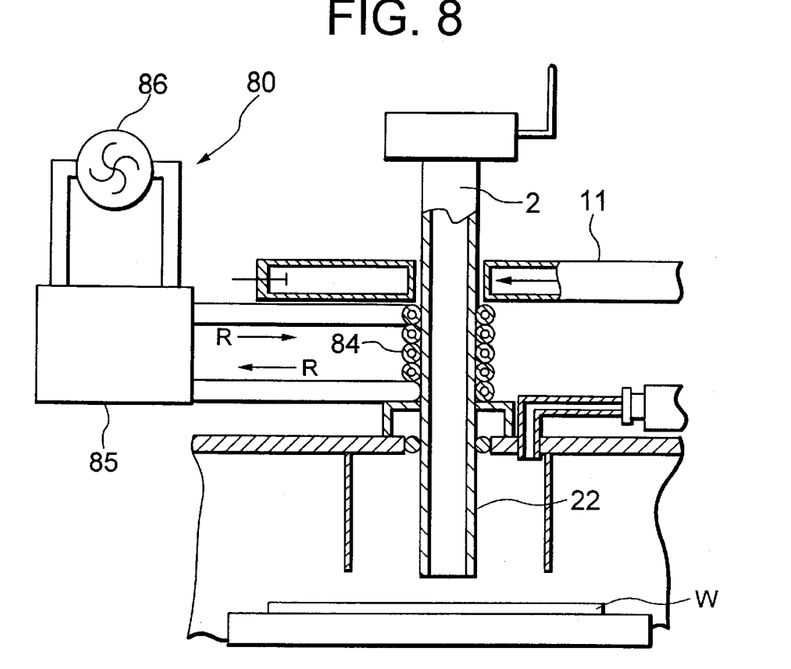
FIG. 8 is a sectional view of the essential portions of a local etching apparatus according to a third embodiment of the present invention.

FIG. 8 is a sectional view of the essential portions of a local etching apparatus according to a third embodiment of the present invention. Note that parts which are the same as those shown in FIG. 1 to FIG. 6 are given the same reference numerals.

This embodiment differs from the first and second embodiments in that the heater is comprised of a thin tube wound around the alumina discharge tube 2 and fed with a fluid of a predetermined temperature so as to heat the alumina discharge tube 2.

The heater 83 is provided with a thin tube 84 as a heating block, a temperature control unit 85, and a fluid circulation pump 86. At the time of operation, it is possible to specifically work the local etching method according to the aspect of the invention.

The thin tube 84 is wound around the alumina discharge tube 2 in a state contacting its outside. The inside constitutes a fluid storage portion. The thin tube 84 passes through the inside of the temperature control unit 85 to reach the pump 86. The fluid feed port and fluid exhaust port of the thin tube 84 are connected to the exhaust side and intake side of the pump 86.

Due to this configuration, the fluid R inside the thin tube 84 is made to circulate by the pump 86, is heated by the temperature control unit 85, and heats the alumina discharge tube 2 to temperature $T_0$.

The rest of the configuration, mode of operation, and advantageous effects are similar to those of the above first and second embodiments, so descriptions thereof will be omitted.

Note that the invention is not limited to the above embodiments. Various modifications and changes may be made within the scope of the gist of the invention.

In the first embodiment, the heater 6 was turned off substantially simultaneously with the execution of the plasma discharge step and was turned on substantially simultaneously with the end of the local etching step, but it is also possible to leave the heater 6 on at all times to keep the temperature of the alumina discharge tube above the temperature $T_0$ at all times.

Further, in the first embodiment, a heating wire 60 was used as the heating member, but it is also possible to use a heating plate instead of the heating wire 60 and make the heating plate abut the outside of the alumina discharge tube 2.

In the second embodiment, infrared rays S were used to heat the alumina discharge tube 2, but it is also possible to use a laser beam etc. to heat it.

Figure 9:
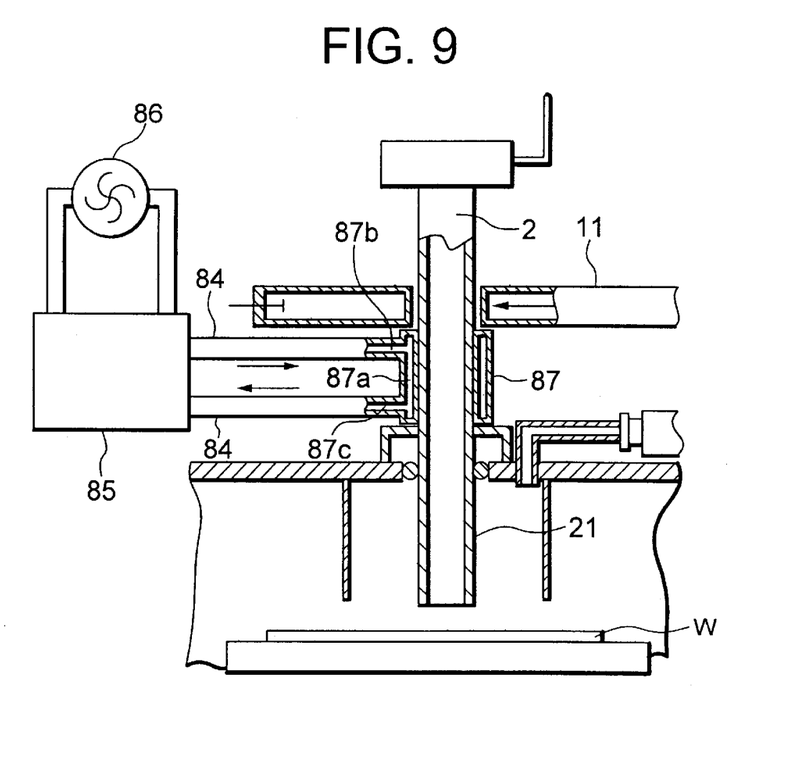
FIG. 9 is a sectional view of a modification of a local etching apparatus.

In the third embodiment, a thin tube 84 was used as the heating block, but as shown in FIG. 9 it is also possible to bring a hollow body 87 having a fluid storage portion 87a inside it into contact with the outside of the alumina discharge tube 2, connect the thin tube 84 to a fluid feed port 87b and fluid exhaust port 87c of the hollow body 87, and communicate the thin tube 84 to the fluid storage portion 87a.

In the above embodiments, an alumina discharge tube 2 was used as the discharge tube, but any of an aluminum nitride discharge tube, sapphire discharge tube, and quartz discharge tube may be used instead of the alumina discharge tube 2.

For example, in the above embodiments, $SF_6$ gas was used as the radical R producing gas, but $CF_4$ (carbon tetrafluoride) or $NF_3$ (nitrogen trifluoride) gas may also be used. Further, it is also possible to feed not a single $SF_6$ gas, but a mixed gas of $SF_6$ gas and $O_2$ gas or other gas to the alumina discharge tube 2.

As explained in detail above, according to the present invention, since the discharge tube is preheated to at least a temperature at which the etching depth of the object to be etched becomes substantially constant, there is no need to wait with the local etching work until the discharge tube rises to that temperature by the heat resulting from the plasma discharge as in the conventional local etching apparatus. Therefore, it is possible to perform the local etching work immediately. As a result, there is the superior effect that it is possible to improve the throughput of the flattening of the object to be etched.

What is claimed is:

1. A local etching apparatus comprising:
   a discharge tube with a spray port of a nozzle portion facing an object to be etched in a chamber;
   a plasma generator for causing plasma discharge of a gas in said discharge tube so as to produce radicals for locally etching a relatively thick portion present on a surface of the object to be etched, wherein said plasma generator comprises a microwave generator for generating a microwave and a waveguide for guiding the microwave generated by said microwave generator and being fit over said discharge tube; and
   a heater for heating said discharge tube to a predetermined temperature, wherein said heater comprises a heating member capable of raising the temperature in accordance with voltage applied thereto said heating member being provided so as to surround a location below a discharge location where said waveguide and said discharge tube intersect, and a voltage controller for preheating said discharge tube to at least a temperature at which the etching depth of the object to be etched becomes substantially constant by controlling the voltage applied to said heating member.

2. A local etching apparatus as set forth in claim 1, wherein said heating member of said heater is a heating wire wound around said discharge tube.

3. A local etching apparatus comprising:
   a discharge tube with a spray port of a nozzle portion facing an object to be etched in a chamber;
   a plasma generator for causing plasma discharge of a gas in said discharge tube so as to produce radicals for locally etching a relatively thick portion present on a surface of the object to be etched, wherein said plasma generator comprises a microwave generator for generating a microwave and a waveguide for guiding the microwave generated by said microwave generator and being fit over said discharge tube;
   a heater for heating said discharge tube to a predetermined temperature wherein said heater is an optical heater for preheating said discharge tube to at least a temperature at which the etching depth of the object to be etched becomes substantially constant by emitting infrared rays or a laser beam to a location below a discharge location where said waveguide and said discharge tube intersect.

4. A local etching apparatus comprising:
   a discharge tube with a spray port of a nozzle portion facing an object to be etched in a chamber;
   a plasma generator for causing plasma discharge of a gas in said discharge tube so as to produce radicals for locally etching a relatively thick portion present on a surface of the object to be etched, wherein said plasma generator comprises a microwave generator for generating a microwave and a waveguide for guiding the microwave generated by said microwave generator and being fit over said discharge tube;
   a heater for heating said discharge tube to a predetermined temperature, wherein said heater comprises a heating block having a fluid feed port and fluid exhaust port communicating with a fluid storage portion at the inside disposed so as to surround a location below a discharge location where said waveguide and said discharge tube intersect in a state contacting the outer side of said discharge tube, and a fluid feeder for heating the fluid to a predetermined temperature and feeding it to the fluid storage portion of said heating block, thereby preheating said discharge tube to at least a temperature at which the etching depth of the object to be etched becomes substantially constant.

5. A local etching apparatus as set for in claim 4, wherein said heating block of said heater is comprised of a thin tube wound around said discharge tube.

6. A local etching apparatus as set for in claim 1, wherein said discharge tube is any one of an alumina discharge tube, an aluminum nitride discharge tube, a sapphire discharge tube, and a quartz discharge tube.

7. A local etching apparatus as set for in claim 2, wherein said discharge tube is any one of an alumina discharge tube, an aluminum nitride discharge tube, a sapphire discharge tube, and a quartz discharge tube.

8. A local etching apparatus as set for in claim 3, wherein said discharge tube is any one of an alumina discharge tube, an aluminum nitride discharge tube, a sapphire discharge tube, and a quartz discharge tube.

9. A local etching apparatus as set for in claim 4, wherein said discharge tube is any one of an alumina discharge tube, an aluminum nitride discharge tube, a sapphire discharge tube, and a quartz discharge tube.

10. A local etching apparatus as set for in claim 5, wherein said discharge tube is any one of an alumina discharge tube, an aluminum nitride discharge tube, a sapphire discharge tube, and a quartz discharge tube.

* * * * *